United States Patent [19]

Haskell et al.

[11] Patent Number: 4,962,064
[45] Date of Patent: Oct. 9, 1990

[54] METHOD OF PLANARIZATION OF TOPOLOGIES IN INTEGRATED CIRCUIT STRUCTURES

[75] Inventors: Jacob D. Haskell, Palo Alto; Craig S. Sander, Mountain View; Steven C. Avanzino, Cupertino; Subhash Gupta, San Jose, all of Calif.

[73] Assignee: Advanced Micro Devices, Inc., Sunnyvale, Calif.

[21] Appl. No.: 193,478

[22] Filed: May 12, 1988

[51] Int. Cl.$^5$ ............................................. H01L 21/465
[52] U.S. Cl. ................................... 437/228; 437/233; 437/62; 148/DIG. 51
[58] Field of Search ................. 437/67, 228, 225, 233, 437/229, 238, 240, 235, 62; 148/DIG. 51

[56] References Cited

U.S. PATENT DOCUMENTS

| | | | |
|---|---|---|---|
| 4,662,064 | 5/1987 | Hsu | 437/199 |
| 4,789,648 | 12/1988 | Chow | 437/238 |

FOREIGN PATENT DOCUMENTS

| | | | |
|---|---|---|---|
| 0023146 | 1/1981 | European Pat. Off. | 148/DIG. 51 |
| 0148988 | 12/1978 | Japan | 437/67 |
| 0030136 | 2/1983 | Japan | 437/67 |
| 0048936 | 3/1983 | Japan | 437/67 |
| 0124142 | 7/1984 | Japan | 437/67 |
| 0175137 | 10/1984 | Japan | 437/67 |

OTHER PUBLICATIONS

Chen, J. Y. et al., "A Fully Recessed Field Isolation Technology Using Photo-CVD Oxide", *IEDM*, vol. 82, 1982, pp. 233-236.

Shibata, T. et al., "A Simplified Box (Buried-Oxide) Isolation Technology for Megabit Dynamic Memories", *IEDM*, vol. 83, 1983, pp. 27-30.

*Primary Examiner*—Brian E. Hearn
*Assistant Examiner*—Trung Dang
*Attorney, Agent, or Firm*—John P. Taylor

[57] ABSTRACT

A method is disclosed for making a highly planarized integrated circuit structure having deposited oxide portions planarized to the level of adjacent portions of the integrated circuit structure which comprises: deposition, over an integrated circuit structure having first portions at a height higher than the remainder of the integrated circuit structure, a conformal oxide layer; depositing a layer of a planarizing material such as polysilicon over the conformal oxide layer; polishing the structure a first time to expose the highest portions of the underlying conformal oxide layer; etching the structure a first time with an etchant system capable of removing the conformal oxide preferentially to the planarizing material; further polishing the structure a second time to remove planarizing material left from the first etching step; and then optionally etching the remainder of the structure to remove any remaining planarizing material and the remaining conformal oxide over the raised portions of the underlying integrated circuit structure to provide the desired highly planarized structure.

31 Claims, 6 Drawing Sheets

METHOD OF PLANARIZATION OF TOPOLOGIES IN INTEGRATED CIRCUIT STRUCTURES

BACKGROUND OF THE INVENTION

1. Field of the Invention

This invention relates to integrated circuit structures. More particularly, this invention relates to an improved method for forming highly planarized oxide portions in integrated circuit structures.

2. Description of the Related Art

In the conventional construction of integrated circuit structures, field oxide, for example, is usually grown on and into the surface of the silicon substrate to provide oxide insulation between adjacent active devices by masking the active device regions of the substrate and then oxidizing the remaining portions of the substrate.

In the formation of such oxide regions by oxidation of the silicon substrate, that is, by oxide growth rather than by deposition, the oxide grows down into the substrate as well as extending upwardly from the surface. For example, when growing an oxide layer of about one micron thickness, the oxide growth will extend down into the substrate about half the distance, that is, extend down about 0.5 micron below the original silicon substrate surface and also extend about 0.5 micron above the original silicon substrate surface, due to the fact that a given number of silicon atoms in crystalline silicon occupies less volume than the oxide of the same number of silicon atoms.

While this phenomena changes the vertical topology of the integrated circuit structure somewhat, the greater problem is that this expansion of the oxide volume also occurs laterally as well as vertically. Thus, as shown in the prior art structure shown in FIG. 1, the field oxide grown in the unmasked regions of the substrate also extends partially into the masked regions of the substrate with both the downwardly and upwardly extent of the oxide tapering off the further the oxide extends laterally, thus forming what is known in the industry as a "bird's beak".

This "bird's beak" region then narrows the active region of the substrate in between the field oxide portions in which active devices can be constructed, as shown in FIG. 1, down to a width x with the width of the mask minus x representing the area of lateral encroachment of the grown oxide. To remedy this, the dimensions of the mask must be altered to accommodate this encroachment, i.e., the openings for the field oxide must be made smaller.

This, in turn, becomes a problem as the density of integrated circuit structures increase with VLSI. When the lines and spaces, for example, become less than one micron, problems of lithography occur. Furthermore, there may be yet further encroachment if the field implant, i.e., the doping beneath the field oxide, laterally migrates with the field oxide as it grows, thus reducing the active device region still further.

The problems associated with "growing" field oxide regions in an integrated circuit structure has been recognized and attempts have been made to remedy these problems. For example, Chen et al, in an article entitled "A FULLY RECESSED FIELD ISOLATION TECHNOLOGY USING PHOTO-CVD OXIDE", published in IDEM 82 at pp. 233–236, discuss the use of a photoresist layer to etch a groove which is then filled with a photox-CVD oxide (photox) before removing the photoresist mask. Excess "photox" is then removed with the photoresist by liftoff.

Shibata et al, in an article entitled "A SIMPLIFIED BOX (BURIED-OXIDE) ISOLATION TECHNOLOGY FOR MEGABIT DYNAMIC MEMORIES", published in IDEM 83 at pp 27–30, discuss forming isolation oxide by refilling anisotropically etched recesses in silicon substrates with deposited oxide. The original BOX process used two steps, a plasma $SiO_2$ lift-off in the first step and redeposition of CVD $SiO_2$ followed by planarization etch-back in the second step. The authors noted that this procedure works satisfactorily for recesses narrow in width, but fails to leave field oxide in wide open areas. The authors suggest using two resist layers with the first resist providing a mask over the oxide in the wide open areas and the second resist layer apparently acting as a planarizing layer.

We have found a more satisfactory way to form highly planarized field oxide regions between active regions in the substrate while eliminating the formation of the "bird's beak" encroachment experienced with prior art field oxide growth. This method permits us to form highly planarized field oxide type separation between active regions, such as, for example, either active devices formed in the substrate or between stepped regions in an integrated circuit structure such as those which occur when conductive lines are formed over the substrate, whereby the topology of the resulting structure will minimize formations of such steps or other nonplanar structures, i.e., will result in a highly planarized integrated circuit structure.

SUMMARY OF THE INVENTION

It is, therefore, an object of this invention to provide a process for producing highly planarized oxide portions in an integrated circuit structure.

It is a further object of this invention to provide a process for producing highly planarized oxide portions in an integrated circuit structure using deposited oxide.

It is another object of this invention to provide a process for producing highly planarized oxide portions in an integrated circuit structure using deposited oxide which is planarized to the level of adjacent portions of the integrated circuit structure by applying a further layer of planarizing material over the structure.

It is yet another object of this invention to provide a process for producing highly planarized oxide portions in an integrated circuit structure using deposited oxide which is planarized to the level of adjacent portions of the integrated circuit structure by applying a further layer of planarizing material over the structure and then subjecting the structure to polishing and etching steps, respectively, to form a substantially flat surface and remove the deposited oxide and any remaining planarizing material down to the level of the underlying structure.

It is still a further object of the invention to provide a highly planarized field oxide for an integrated circuit structure which is deposited in shallow openings provided in the underlying silicon substrate between active regions in said substrate by first forming such shallow openings in the substrate; depositing a layer of oxide which is thicker than the depth of the shallow openings to form a conformal layer of oxide over the structure; forming a planarizing layer over the deposited oxide layer; mechanically polishing the structure to remove the planarizing layer over the highest regions at least down to the highest level of the underlying deposited oxide; etching the exposed oxide down to a level approximately equal to the original height of the lowest portion of the unexposed area of the oxide layer; mechanically polishing the structure further to remove the remaining portions of the planarizing layer; and then etching the remaining structure down to the level of the top surface of the active regions of the substrate to thereby form a highly planarized structure comprising oxide portions in the substrate level with the substrate level in the active region of the substrate.

It is yet a further object of the invention to provide a highly planarized integrated circuit structure comprising a raised or stepped pattern interleaved with oxide portions formed by depositing an oxide layer over an integrated circuit structure containing such a raised pattern, the oxide layer having a thickness greater than the thickness of the raised pattern, to form a conformal layer of oxide over the structure; forming a planarizing layer over the deposited oxide layer; mechanically polishing the structure to remove the planarizing layer over the highest regions at least down to the highest level of the underlying deposited oxide; etching the exposed oxide down to a level approximately equal to the original height of the lowest portion of the unexposed area of the oxide layer; and then mechanically polishing the structure further to remove the remaining portions of the planarizing layer to result in a highly planarized top surface. Optionally the remaining structure may be etched down to the level of the top surface of the raised pattern to thereby form a highly planarized structure with oxide in the spaces between the exposed raised pattern.

These and other objects of the invention will be apparent from the following description and accompanying drawings.

DETAILED DESCRIPTION OF THE INVENTION

The invention provides an improved method for forming highly planarized topologies in integrated circuit structures wherein oxide is used between active or conductive regions formed in or on an integrated circuit structure. In the illustrated embodiments, the process of the invention is shown, by way of illustration and not of limitation, as applied either to the formation of a highly planarized integrated circuit structure having field oxide deposited between active regions in a silicon substrate; or in forming a highly planarized structure with a raised pattern such as, but not limited to, metal lines formed over an integrated circuit structure previously formed in and on a substrate, with oxide between or upon the raised pattern.

Figure 1:
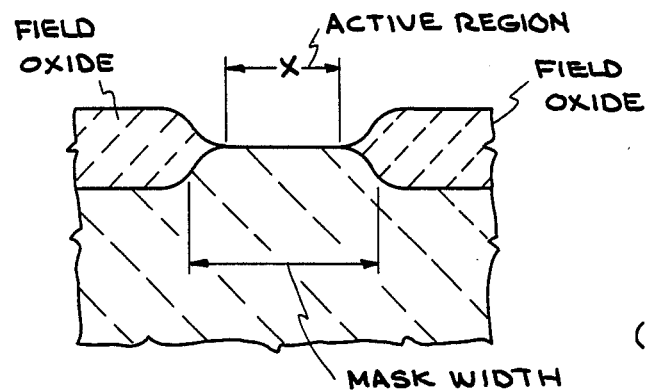
FIG. 1 is a fragmentary vertical cross-section of a prior art structure showing the formation of a "bird's beak" by growth of field oxide regions in a silicon substrate which encroach into the active device region of the substrate.
Figure 2:
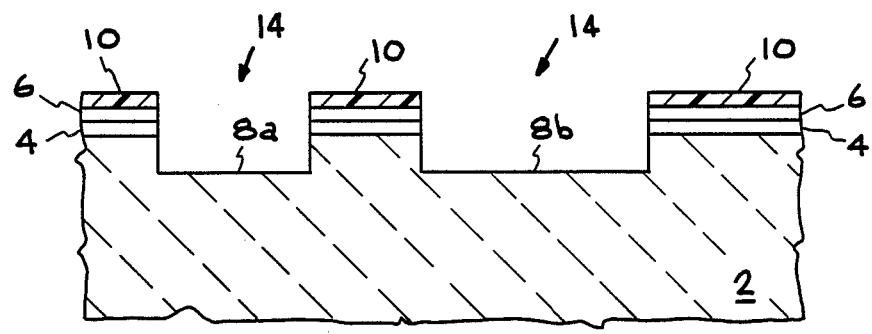
FIG. 2 is a fragmentary vertical cross-section showing an early stage of a first embodiment of the invention wherein a silicon substrate has been masked to cover active regions of the substrate and openings have been etched in the silicon substrate through the mask openings.

Referring now to FIG. 2, a silicon substrate 2 is shown with a photoresist mask 10 thereon over active regions to be formed in the substrate and having openings 14 in mask 10 conforming to desired field oxide regions to be formed in silicon substrate 2. As shown in FIG. 2, openings 8a and 8b have already been etched in silicon substrate 2 through mask openings 14 to a depth of, for example, from about 0.45 to about 0.55 microns.

Before forming mask 10 over substrate 2, an oxide layer 4 may be grown on the surface of substrate 2 to a thickness of, for example, 300–500 Angstroms, as shown in FIG. 2, followed by deposition of about 1000 to about 2000 Angstroms, preferably about 1300 to about 1500 Angstroms, of silicon nitride 6 which may form an optional etch block for subsequent etching steps. Since the layer of oxide is used merely as an underlying layer for the optional nitride etch block layer, elimination of nitride layer 6 can also result in elimination of oxide layer 4 as well if desired. Alternatively, if desired, oxide layer 4 may be used beneath resist mask 10 even when nitride layer 6 is omitted.

Openings 8a and 8b are etched in silicon substrate 2, in one embodiment, by an anisotropic etch, such as a reactive ion etch (RIE) process, to form substantially orthogonal sidewalls, that is, sidewalls normal to both the plane of the substrate surface prior to the etch and normal to the bottom of openings 8a and 8b.

Figure 2A:
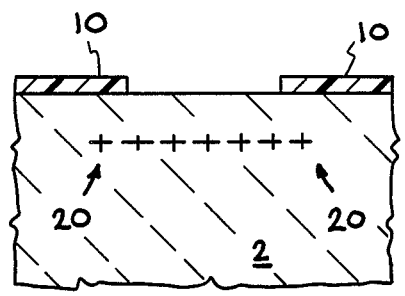
FIG. 2A is a fragmentary vertical cross-section of an alternate step in the process to produce the structure of FIG. 2 showing an optional field implant before forming the openings for the field oxide.
Figure 2B:
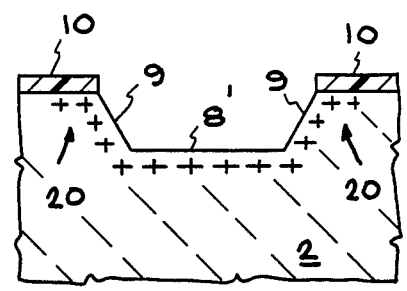
FIG. 2B is a fragmentary vertical cross-section of the structure of FIG. 2A showing a further field implant after forming openings for the field oxide.

In a variation of this embodiment, where it is desired to perform a field implant beneath the field oxide region to be formed in openings 8a and/or 8b etched in substrate 2, for example, when forming an n-channel device where undesirable inversion in the substrate can occur, the substrate may be implanted prior to forming the field oxide, as shown in FIGS. 2A and 2B.

As shown in FIG. 2A, a first implantation and diffusion doping of substrate 2 may be carried out prior to any etching step through openings 14 in mask 10. By conducting this doping step prior to the etching step, some of the dopant will laterally scatter and diffuse into the edge of the adjacent active device region of the substrate as shown at 20, representing a crucial area where voltage inversion should be avoided. This doping step, for example, may be carried out by implanting boron followed by diffusion at between about 800° and 900° C., for at least 15 minutes to result in a final boron concentration high enough to prevent field inversion, typically $10^{16}$ cm$^{-3}$.

Alternatively, as shown in FIG. 2B, after the etching of opening 8′ (which may be carried out to the same depth as openings 8a and 8b), a second doping step may be carried out to dope the newly exposed substrate surfaces over or against which the field oxide will be deposited. As shown in FIG. 2B, advantageously sidewall 9 of substrate opening 8′ will be formed by adjusting the anisotropic etch slightly to form sidewalls with an inward slope of about 3–5 degrees to facilitate doping of sidewalls 9 of opening 8′. The bottom and sidewalls of substrate 2 exposed by opening 8′ may then be doped with boron to a concentration sufficient to prevent field inversion, typically $10^{16}$ cm$^{-3}$.

Figure 3:
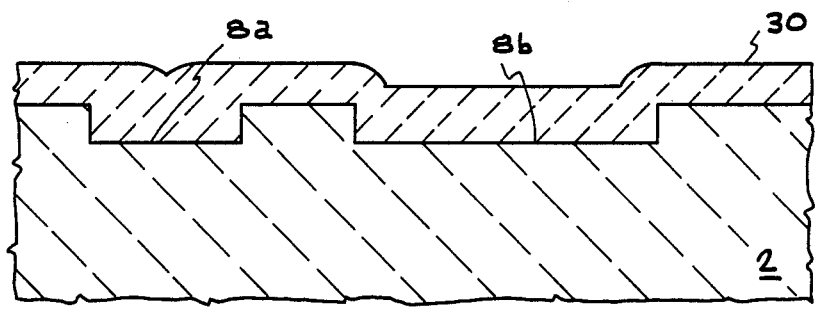
FIG. 3 is a fragmentary vertical cross-section showing the structure shown in FIG. 2 at a later stage of the process with the mask removed and a conformal oxide layer deposited over the substrate and in the etched away openings in the substrate.

After forming openings 8a and 8b (or 8′), mask 10 is removed and, as shown in FIG. 3, a conformal layer of oxide 30 is deposited over the entire structure to a thickness sufficiently in excess of the depth of openings 8a and 8b so that the level of oxide in the lowest point in the widest opening 8b is above the highest point in the adjoining active regions of the substrate, including any layers, such as oxide 4 or nitride 6 thereon, which were shown in FIG. 2.

Figure 4:
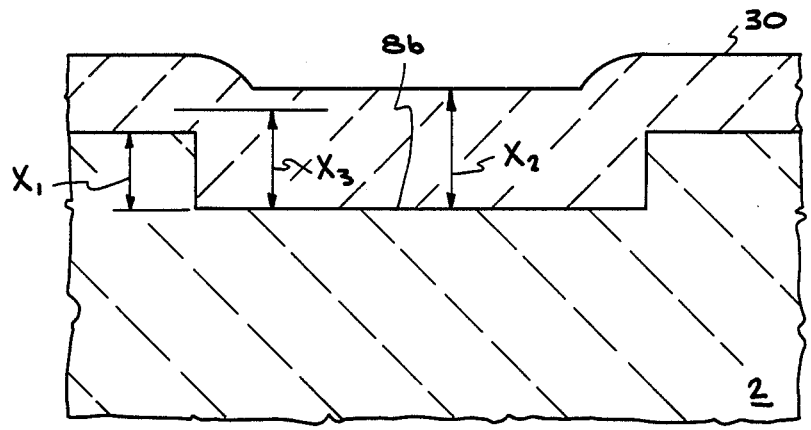
FIG. 4 is an enlarged fragmentary vertical cross-section of a portion of the structure of FIG. 3 showing the difference between the depth $X_1$ of the etched area and the minimum thickness $X_2$ of the oxide layer over the structure, with $X_3$ representing an intermediate level between $X_1$ and $X_2$.

It will be noted that the height of oxide layer 30 over wide area 8b is not as high as over narrower etched area 8a. As previously discussed with respect to the prior art, when wide areas are etched and then filled with oxide to form a field oxide region, oxide layer 30 tends to conform to the underlying topography. Since the eventual structure, in accordance with the invention, will be highly planarized, it is important to the practice of the present invention that the thickness of oxide layer 30 over wide area 8b exceed the depth of area 8b from the unetched surface. This is illustrated in the enlarged region of FIG. 3 shown in FIG. 4 wherein the depth of etched area 8b from the surface is represented by $X_1$ while the thickness of oxide layer 30 over area 8b is represented by $X_2$.

In accordance with the invention, the thickness of oxide layer 30 over wide area 8b ($X_2$) must be greater than the depth $X_1$ of area 8b. The difference between $X_1$ and $X_2$ is preferably from about a minimum of about 0.15 microns up to about 0.45 microns. Greater thicknesses of oxide may be used, if desired, but are unnecessary. Thus, for example, when the depth of area 8b is about 0.5 microns, the thickness of oxide layer 30 over area 8b will range from about 0.65 up to 0.95 microns.

Preferably, the deposited oxide is highly conformal, such as, for example, tetraethyl orthosilicate (TeOS), which is deposited at a temperature of from about 700° to about 750° C. Alternatively, the deposited oxide may comprise a low pressure chemical vapor deposition (CVD) oxide layer deposited at a temperature of from about 350° to about 450° C.

Figure 5:
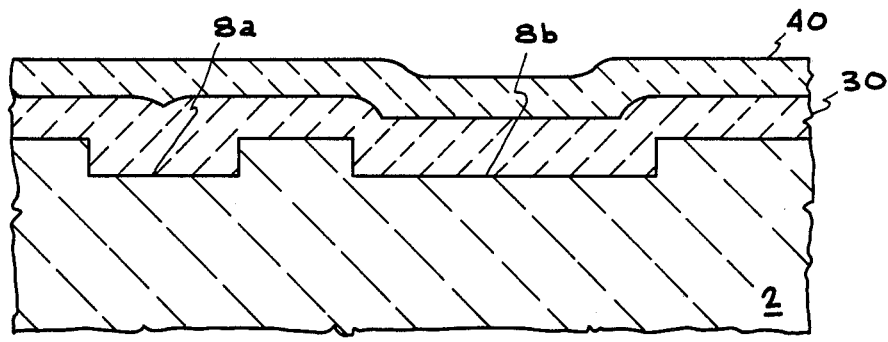
FIG. 5 is a fragmentary vertical cross-section of the structure of FIG. 3 after a layer of planarizing material has been deposited over the conformal oxide layer.

As shown in FIG. 5, a planarizing layer 40, preferably comprising polysilicon, is then deposited over conformal oxide layer 30. Planarizing layer 40 may comprise any material which will polish at a faster rate than oxide and which may be selectively etched at a rate less than or equal to that of the conformal oxide. In addition to polysilicon, for example, aluminum metal may be used for planarizing layer 40.

Planarizing layer 40 will be described hereinafter as polysilicon layer 40 by way of illustration and not of limitation. The thickness of polysilicon layer 40 should typically be at least equal to or greater than the depth of the etched area in the substrate $X_1$, though thinner polysilicon films also are feasible.

After deposition of polysilicon layer 40, the structure is mechanically or chemically/mechanically polished, using, for example, a sufficiently flat abrasive means so that only the highest points of the structure are contacted without the abrasive means conforming to depressed areas.

The abrasive means used in the polishing step may comprise either a purely mechanical polish using, for example, as a polishing material an aqueous slurry of finely divided $Al_2O_3$ or $SiO_2$ particles, with the pH adjusted to about 7, spread on a flat teflon disk, or the polishing material may also include a minor amount of a hydroxide such as KOH or NaOH added in a sufficient amount to increase the pH to about 9-11.

Figure 6:
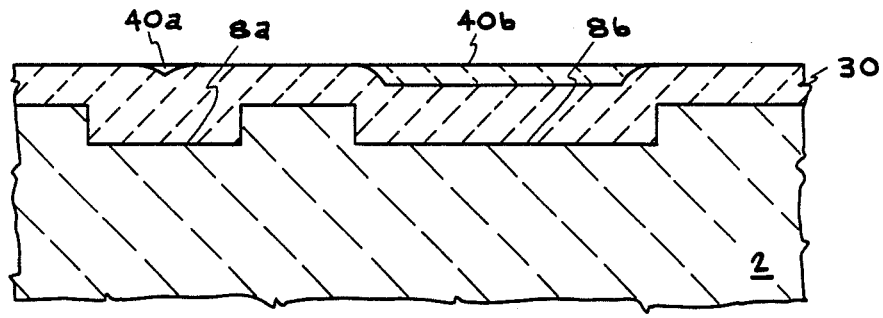
FIG. 6 is a fragmentary vertical cross-section showing the structure of FIG. 5 mechanically or chemically/mechanically polished to remove sufficient planarizing material to expose the highest portions of the underlying conformal oxide layer.

This first polishing step is carried out until the highest portions of underlying conformal oxide layer 30 are exposed leaving polysilicon portions 40a and 40b over lower levels of oxide layer 30, as shown in FIG. 6. A typical selectivity of >200:1 can be obtained for polysilicon to oxide removal by chemical/mechanical polishing.

Figure 7:
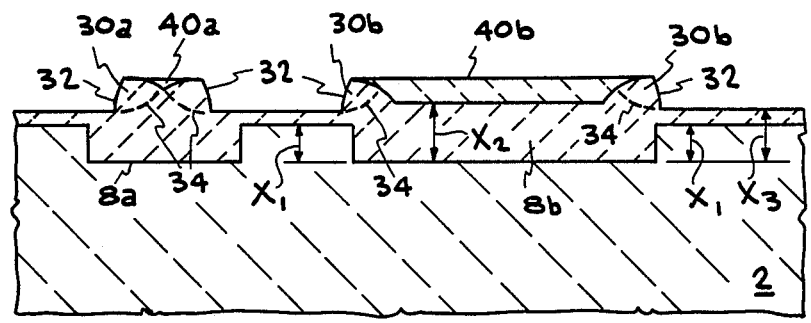
FIG. 7 is a fragmentary vertical cross-section showing the structure of FIG. 6 after an etch which removes oxide at a faster rate than planarizing material which therefore leaves high spots of oxide capped with planarizing material where the slower etching planarizing material shields the underlying oxide and the oxide not covered by planarizing material removed down to a level $X_3$.

The structure is then selectively etched using an etchant system, such as, for example, a reactive ion etch (RIE), using $CHF_3$ chemistry with the oxygen level adjusted to favor oxide removal over polysilicon removal or by a wet etch such as hydrofluoric acid (HF) diluted in water ($H_2O$) to a volume ratio of, for example, 40:1 $H_2O$/HF. For the case of an RIE etch, for example, the etch ratio may be preferably adjusted to provide an etch ratio of, for example, about 5:1 to about 10:1, oxide to polysilicon etch removal rate, i.e., to remove oxide at a rate 5-10 times faster than the polysilicon etch removal rate. Referring to FIG. 7, the etch step is carried out for a sufficient time to etch back the oxide layer down to a level $X_3$ which is higher than $X_1$ but less than $X_2$ by an amount not exceeding approximately 0.1 microns as will be discussed below. It will be noted that solid lines 32 indicates the edge of oxide layer portions 30a and 30b when a dry etch such as an RIE etch is used while dotted lines 34 indicate the edge of oxide layer portions 30a and 30b when a wet etchant is used.

It should be noted with regard to this etch step that the minimum as deposited thickness of polysilicon planarizing layer portion 40b over etched area 8b is related to (1) the step height $X_1$ of the etched substrate, (2) the etch ratio of oxide removal to polysilicon removal, and (3) the amount of polysilicon removed in the polishing step over area 8b by the following formula:

$$P_{min} = X_1/E_{ratio} + M$$

where:

$P_{min}$ = minimum thickness of planarizing layer 40;

$X_1$ = depth of the etched area in the substrate from the surface which is approximately equal to the amount of oxide removed to reach level $X_3$;

$E_{ratio}$ = etch ratio of oxide layer 30 to planarizing layer 40;

M = thickness of polysilicon removed by polishing step.

This relationship ensures that as the oxide is selectively etched, the polysilicon will be etched at a sufficiently slow rate, relative to the thickness of the polysilicon so that all of the polysilicon will not be removed before the selective etch is stopped and so that none of the oxide beneath the polysilicon in region 8b is removed.

This relationship is important because the selective etch step is intended to lower the overall oxide level (in the regions not covered by polysilicon) to a height $X_3$ which is below $X_2$, and higher than $X_1$. While eventually all of the oxide will be removed down to the level of the unetched or active regions of the substrate, to ensure the highly planarized surface which characterizes the process of the invention, more control of the removal of the last portions of the oxide can be maintained by using a second polishing step to remove the remainder of the polysilicon as will be described below followed by uniform removal of oxide over the entire surface area.

This selective etch step just described will result in high spots of polysilicon 40a and 40b bordered by minor oxide portions left on the structure due to the selectivity of the preceding etch step as shown in FIG. 7 with minor oxide portions 30a and 30b left in those portions of oxide layer 30 shielded by polysilicon portions 40a and 40b.

Figure 8:
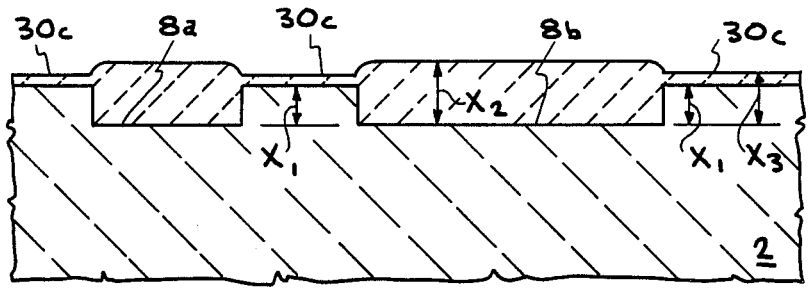
FIG. 8 is a fragmentary vertical cross-section showing the structure of FIG. 7 after a second polishing step to remove the planarizing material/oxide high spots.

These polysilicon portions 40a and 40b, as well as remaining oxide portions 30a and 30b are then removed by a second polishing step, which again may be either mechanical or chemical/mechanical. This polishing step is carried out until the level of these high spots is reduced to reach a level somewhere between $X_2$ and $X_3$, and until all of the polysilicon planarizing layer 40 (40a and 40b) is removed leaving a thin oxide layer 30c, as shown in FIG. 8.

Figure 9:
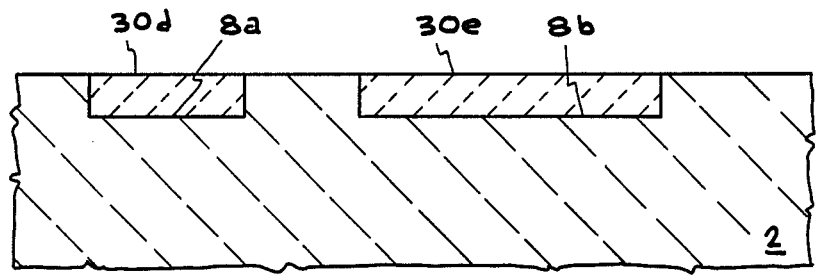
FIG. 9 is a fragmentary vertical cross-section showing the structure after performing the final step of this embodiment showing the structure of FIG. 8 with further conformal oxide removed by a second etch until the top surface of the active regions of the substrate are exposed leaving a highly planarized structure.

The oxide layer 30 is then further etched to expose and planarize the structure down to the level of the adjoining active regions of the substrate, as shown in FIG. 9. This etch step is preferably carried out using either the RIE or wet etching methods described previously.

The foregoing describes the process when the lowest level of oxide layer 30, as deposited, will be $X_2$, the level above the bottom of the widest etched away regions 8b. In some instances, however, narrower openings or etched away areas may not be filled with oxide up to the level of $X_2$ which, in turn, means that some planarizing material will remain in these low regions after the second polishing step of the polysilicon or other planarizing material. This is shown under the dotted line as 31 in FIG. 10.

Figure 10:
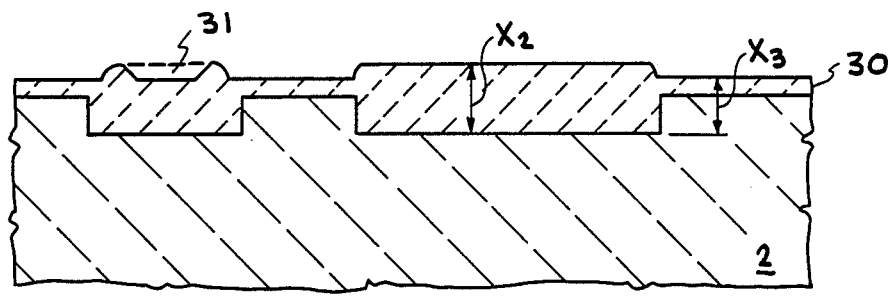
FIG. 10 is a fragmentary vertical cross-section of an alternate embodiment showing, under the dotted line, residual planarizing material which occurs when the conformal oxide layer thickness is less than $X_2$.

When region 31 in FIG. 10 is filled with polysilicon, which then still remains after the second polishing step discussed above, this problem may be solved as follows. The additional polysilicon remaining at 31 may be removed by dividing the final etch step into two steps with the first step comprising a 1:1 oxide to silicon etch whereby the polysilicon in region 31 will be removed at the same rate as the surrounding oxide. The ratio would then be changed, after all of the polysilicon in region 31 was removed, back to the selective oxide ratio, e.g. 5:1 to 10:1, so that the final etch could still be stopped when the active (unetched) region of the silicon substrate was reached as in the earlier described embodiment.

Figure 11:
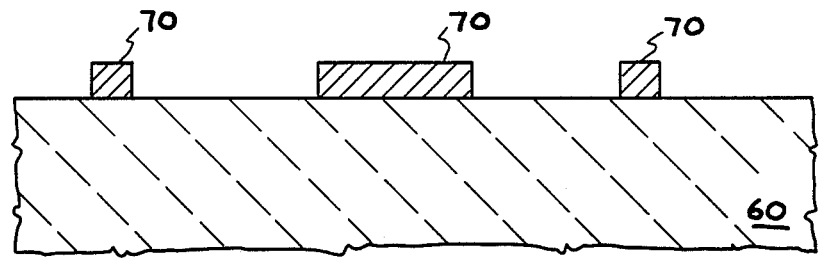
FIG. 11 is a fragmentary vertical cross-section of another second embodiment of the invention showing a structure with a raised pattern formed over an integrated circuit structure.

Turning now to FIGS. 11-17, another embodiment of the process of the invention is shown commencing with FIG. 11 wherein an integrated circuit structure 60, which may include previously formed active devices in or on the surface of a substrate, such as a silicon substrate, is shown provided with a raised pattern 70 over the substrate surface.

Patterned layer 70 might, for example, comprise a 3000 to 10,000 Angstrom layer of a conductor, e.g., metal patterned to form metal lines or interconnects. When layer 70 comprises a conductor, it may comprise any conductor conventionally used in forming integrated circuit structures, such as, for example, aluminum, polysilicon, or tungsten, capable of withstanding the temperatures subsequently used in depositing the conformal and planarizing layers thereon.

Raised pattern 70 might also comprise the combination of an insulating layer or step over a raised pattern of conductors, or might only comprise an insulating material. Patterned layer 70, however, will be described below, by way of illustration, and not of limitation, as a metal pattern.

Figure 12:
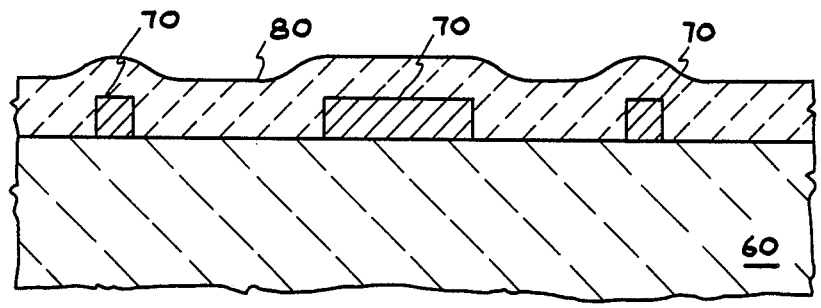
FIG. 12 is a fragmentary vertical cross-section showing the structure of FIG. 11 with a conformal layer of oxide deposited thereon.

As shown in FIG. 12, a conformal layer of oxide 80, such as the previously described TeOS oxide, for use over materials which can withstand temperatures above 700° C., up to 750° C., or a lower temperature CVD oxide, (e.g., deposited at about 350° C.), is deposited over structure 60 and metal pattern 70 to a thickness which, in the widest area between metal lines, will again be a thickness $X_2$, as in the first embodiment, which is greater than $X_1$, the thickness of the metal pattern 70. Usually, the thickness $X_2$ will be greater than the thickness $X_1$ by about 0.2 microns up to about 1.2 microns. The thickness of conformal oxide layer may vary, for example, from about 7000 to about 15,000 Angstroms.

Figure 13:
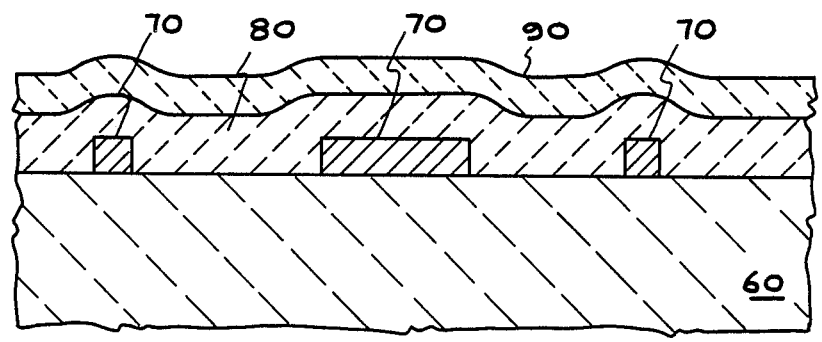
FIG. 13 is a fragmentary vertical cross-section showing a further step of this embodiment with a layer of planarizing material deposited over the conformal layer of the structure of FIG. 13.

As in the first embodiment, a layer of planarizing material 90 such as, for example, polysilicon is now deposited over the structure as shown in FIG. 13. The minimum thickness of this polysilicon layer can be determined using the same equation for $P_{min}$ previously described.

It should be noted here, that if a lower melting metal such as aluminum is used for metal pattern 70, then a lower deposition temperature TeOS oxide, e.g., one deposited at about 350° C., such as plasma TeOS, may be substituted for the previously described conformal oxide; and for the planarizing layer, a material such as tungsten may be deposited instead of the higher temperature polysilicon, or the polysilicon could be sputtered or plasma CVD deposited over oxide layer 80 at temperatures less than 350° C. For purposes of illustration, and not of limitation, the planarizing layer will be described hereinafter as polysilicon, as in the previous embodiment.

Figure 14:
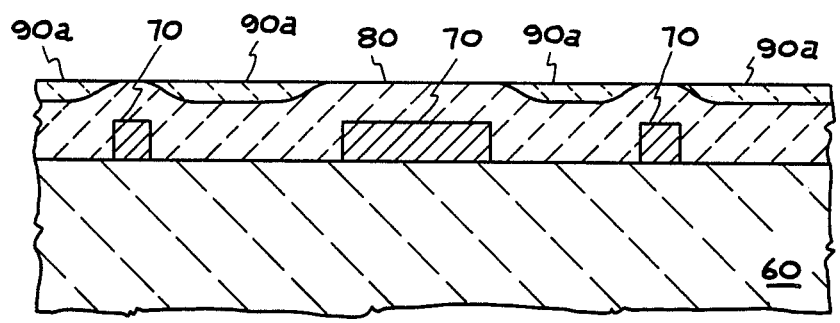
FIG. 14 is a fragmentary vertical cross-section showing polishing of the structure of FIG. 13 until the highest portions of the underlying conformal layer are exposed.

The structure is now polished, similarly to the first polishing step of the first embodiment, to remove polysilicon until the highest areas of the underlying conformal oxide layer 80 are exposed as shown in FIG. 14 leaving polysilicon portions 90a.

Figure 15:
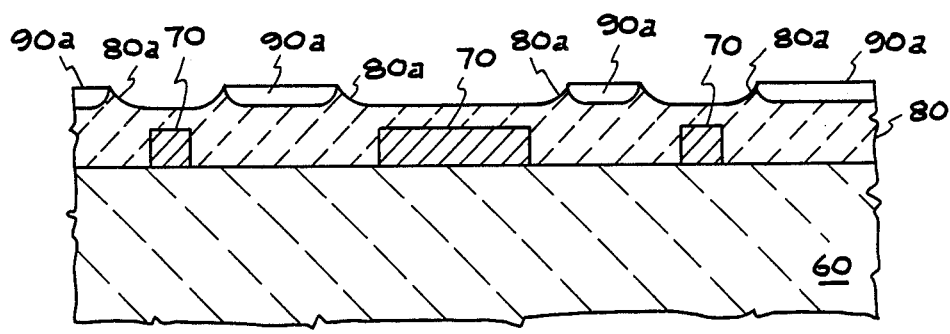
FIG. 15 is a fragmentary vertical cross-section showing the structure of FIG. 14 after an etch which removes oxide at a faster rate than planarizing material, which therefore leaves high spots of oxide where the slower etching planarizing material shields the underlying oxide.

The structure is then etched, as in the first embodiment, using, for example, a wet etch or a reactive ion etch with an etchant system which will remove conformal oxide layer 80 and polysilicon 90a at a ratio of from about 5:1 to 10:1. This etch is carried out to remove oxide now to a level $X_3$ which, as in the first embodiment is higher than $X_1$, but lower than $X_2$ by not more than about 0.1 microns, e.g., about 0.5 microns of conformal oxide layer 80 may be removed for a metal thickness $X_1$ of 0.45 microns. As in the first embodiment, this etch ratio results in high spots or pillars of polysilicon 90a, having oxide portions 80a beneath, as shown in FIG. 15.

Figure 16:
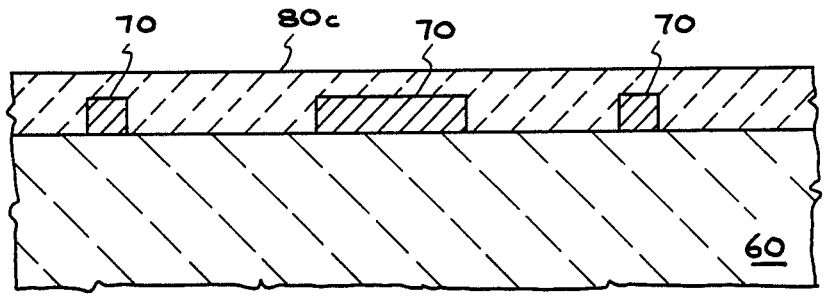
FIG. 16 is a fragmentary vertical cross-section showing the structure of FIG. 15 after a second polishing step to remove the oxide high spots and form a highly planarized structure.

The remaining polysilicon 90a and underlying or adjacent high oxide areas 80a are then removed by a second polishing step, as in the previous embodiments, resulting in the structure depicted in FIG. 16 with planarized oxide layer 80c covering the entire structure.

The structure is then again etched to remove all of the remaining conformal oxide over pattern layer 70 using, for example, a reactive ion etching system which will selectively remove oxide at a faster rate than the material forming pattern layer 70 until the upper surfaces of pattern layer 70 are exposed.

Alternatively, for cases in which it is desirable to have an oxide layer covering the conductor pattern, the final etch step can be omitted to result in the planarized structure as shown in FIG. 16.

Figure 17:
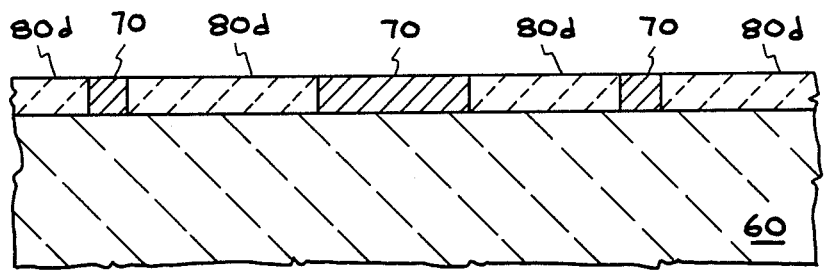
FIG. 17 is a fragmentary vertical cross-section showing a further, but optional, etching step performed on the structure of FIG. 16 to remove sufficient additional conformal oxide to expose the top surface of the raised pattern thereunder resulting in formation of a highly planarized structure.

When the final etch step is performed, the result, as shown in FIG. 17, is a highly planarized structure with oxide 80d formed between the lines of pattern layer 70 at the same level as pattern layer 70.

Thus, the invention provides an improved method for forming highly planarized topology in integrated circuit structures which may be used in forming highly planarized oxide regions adjacent active device regions in a substrate or a highly planarized structure of a raised pattern such as metal lines interleaved with oxide by utilizing a conformal oxide layer over which is applied a planarizing layer of preferably polysilicon followed by a first polishing of the structure and then a first etching of the conformal oxide layer followed by a second polishing step to remove remaining planarizing material followed by a second etching to remove oxide down to the highest level of the integrated circuit thereunder.

Having thus described the invention, what is claimed is:

1. A method of making a highly planarized integrated circuit structure having highly planarized oxide portions using deposited oxide and a polysilicon planarizing material to planarize said deposited oxide by respectively polishing said polysilicon planarizing material and etching said oxide which comprises:
   (a) depositing over an integrated circuit structure having first portions at a height higher than the remainder of said integrated circuit structure, a conformal oxide layer having a thickness which exceeds the height of said first portions above the remainder of said substrate;
   (b) depositing a layer of a polysilicon planarizing material over said deposited conformal oxide layer;
   (c) polishing said structure to remove portions of said polysilicon planarizing material until the highest portions of said underlying conformal oxide layer are exposed;
   (d) etching said exposed highest portions of said conformal oxide layer on said integrated circuit structure in a first etching step with an etchant system capable of removing said conformal oxide layer selectively with respect to said layer of polysilicon planarizing material to remove a portion of said exposed conformal oxide layer;
   (e) polishing said structure again to remove the remainder of said polysilicon planarizing material; and
   (f) etching the remainder of said structure in a second etching step until all of said deposited conformal oxide over said first portions of said integrated circuit structure is removed leaving a highly planarized structure having oxide regions formed therein between said first portions of said integrated circuit structure with the upper surface of said oxide regions substantially level with the upper surface of said first portions of said integrated circuit structure.

2. The method of claim 1 wherein said step of depositing said conformal oxide layer is carried out at a temperature of from about 700° to about 750° C.

3. The method of claim 1 wherein said step of depositing said conformal oxide layer further comprises depositing from about 7000 to about 9000 Angstroms of oxide over said integrated circuit structure.

4. The method of claim 1 wherein said step of depositing said further layer of a planarizing layer comprises depositing a layer of polysilicon over said conformal oxide layer.

5. The method of claim 4 wherein said step of depositing said planarizing layer of polysilicon further comprises depositing from about 0.5 to about 1.0 microns of polysilicon over said conformal oxide layer.

6. The method of claim 4 wherein said step of etching said structure with an etchant system capable of removing said conformal oxide layer selectively with respect to said planarizing layer of polysilicon material further comprises reactive ion etching said conformal oxide layer at a rate at least about 5 times greater than the etching rate for the planarizing layer of polysilicon until said oxide level, in regions where said oxide was previously exposed in said first polishing step, is below the level of said oxide beneath said polysilicon remaining after said first polishing step but above said first portions of said underlying integrated circuit structure.

7. The method of claim 4 wherein said step of etching said structure with an etchant system capable of removing said conformal oxide layer selectively with respect to said planarizing layer of polysilicon material further comprises wet etching said conformal oxide layer at a rate at least about 5 times greater than the etching rate for the planarizing layer of polysilicon until said oxide level, in regions where said oxide was previously exposed in said first polishing step, is below the level of said oxide beneath said polysilicon remaining after said first polishing step but above said first portions of said underlying integrated circuit structure.

8. The process of claim 4 wherein any polysilicon planarizing material, left on said structure after said second polishing step, is removed in said second etching step by etching said oxide and polysilicon, during said second etching step, with an etchant which will remove polysilicon at substantially the same rate as oxide until all of said polysilicon is removed and then changing the etch ratio to favor removal of oxide to facilitate stopping said etch at the level of said first portions of said underlying integrated circuit structure.

9. The method of claim 8 wherein said second etching step after said second polishing step further comprises a first etching carried out at an etch ratio of oxide to polysilicon of about 1:1 and a subsequent etching carried out at an etch ratio of oxide to silicon of at least about 5:1 to inhibit etching of said adjacent portions of said integrated circuit structure.

10. The method of claim 1 further comprising the additional steps of masking active regions of said integrated circuit structure, etching the exposed portions of said integrated circuit structure through said mask to form one or more openings having a depth of from about 0.45 to about 0.55 microns, and removing the mask; whereby said step of depositing a conformal oxide layer comprises depositing said conformal oxide in said etched openings and over said unetched active regions of said integrated circuit structure to a thickness which exceeds the depth of said etched openings whereby said subsequent planarization steps form a planarized integrated circuit structure having field oxide regions therein with the top surface of said field oxide regions at the same level as the top surfaces of said active regions.

11. The method of claim 10 including the further steps of forming an oxide layer over said integrated circuit structure and forming a nitride layer over said oxide layer prior to masking said active regions of said substrate; and said step of etching said exposed portions of said integrated circuit structure through said mask further includes etching said nitride and oxide layers formed beneath said mask.

12. The method of claim 1 including the further step of forming a raised pattern over said integrated circuit substrate and wherein said step of depositing said conformal oxide layer further comprises depositing said conformal oxide to a depth which exceeds the height of said raised pattern above said integrated circuit structure.

13. The method of claim 12 wherein said etching and polishing steps are carried out until a planarized integrated circuit structure is formed with the top surface of said oxide regions at the same level as the top surfaces of said raised pattern.

14. The method of claim 12 wherein said step of forming a raised pattern further comprises forming a pattern of conductive material capable of withstanding the temperatures used in said steps of depositing said conformal oxide layer and said planarizing layer over said raised pattern.

15. A method of making a highly planarized integrated circuit structure having field oxide regions formed therein between active regions of a substrate using a deposited layer of conformal oxide and a polysilicon planarizing layer, and respectively polishing said polysilicon planarizing layer and etching said conformal oxide layer which comprises:
  (a) patterning a silicon substrate with a mask having openings therein conforming to desired formation of field oxide regions in said substrate;
  (b) etching said silicon substrate through said mask to a depth of from about 0.45 microns to about 0.55 microns;
  (c) removing said mask;
  (d) depositing from about 7000 to about 9000 Angstroms of a conformal oxide layer over said structure;
  (e) depositing over said conformal oxide layer a layer of a polysilicon planarizing material;
  (f) mechanically polishing said structure a first time to remove portions of said polysilicon planarizing layer until the highest portions of said underlying conformal oxide layer are exposed;
  (g) selectively etching said exposed highest portions of said conformal oxide layer on said integrated circuit structure a first time with an etchant system capable of removing said deposited conformal oxide and said layer of polysilicon planarizing material at an oxide:planarizing material removal rate of at least about 8:1 until about 0.5 microns of said exposed conformal oxide layer has been removed;
  (h) polishing said structure a second time to remove substantially all of said polysilicon planarizing material left on said structure after said first etching step; and
  (i) etching said structure a second time with an etchant system capable of removing any remaining portions of said polysilicon planarizing material at about the same rate as said oxide until all of said planarizing material is removed; and
  (j) etching the remainder of said structure with an etchant which will etch oxide at a faster rate than silicon until all of said conformal oxide over said active regions is removed leaving a highly planarized structure having field oxide regions formed therein between active regions in the substrate with the upper surface of the field oxide regions substantially level with the surface of the active regions.

16. The method of claim 15 wherein said step of depositing said conformal oxide layer further comprises depositing from about 7000 to about 9000 Angstroms of tetraethyl orthosilicate at a temperature of from about 700° to about 750° C.

17. The method of claim 15 wherein said step of depositing said conformal oxide layer further comprises depositing from about 7000 to about 9000 Angstroms of CVD oxide at a temperature of from about 300° to about 350° C.

18. The method of claim 15 wherein said step of depositing said further layer of planarizing material comprises depositing from about 0.45 to about 0.55 microns of polysilicon over said conformal oxide layer.

19. A method of making a highly planarized integrated circuit structure having a raised pattern thereon, which comprises:
   (a) forming a raised pattern on an integrated circuit structure;
   (b) depositing, at a temperature which will not damage said raised pattern, a conformal oxide layer over said raised pattern having a thickness sufficient, at its lowest point, to exceed the height of said raised pattern;
   (c) depositing, at a temperature which will not damage said raised pattern, a layer of planarizing material over said conformal oxide layer;
   (d) polishing said planarizing layer until the highest level of the underlying conformal oxide is exposed;
   (e) etching said conformal oxide/planarizing layers with an etchant which will remove said oxide at at least about 5 times the rate of removal of said planarizing material until the level of said oxide in areas exposed during said polishing step is reduced by an amount approximately equal to the thickness of said raised pattern; and
   (f) polishing said structure in a second polishing step to remove all of the remainder of said planarizing material from said structure and form a highly planarized surface over said integrated circuit structure.

20. The method of claim 19 including the further step after said second polishing step of removing further conformal oxide down to the upper level of said raised pattern with an etchant which will remove oxide at a faster rate than the rate of removal of said raised pattern to inhibit etching of said raised pattern to form a highly planarized surface comprising said raised pattern interleaved with oxide.

21. The method of claim 19 wherein said step of forming a raised pattern on an integrated circuit structure includes the step of forming a conductive pattern on said structure.

22. The method of claim 21 wherein said step of forming a conductive pattern further comprises forming a metal pattern on said structure.

23. The method of claim 21 wherein said step of depositing said conformal oxide layer further comprises depositing from about 7000 to about 15,000 Angstroms of tetraethyl orthosilicate at a temperature of from about 700° to about 750° C. and said step of forming a conductive pattern on said integrated circuit structure further comprises forming a conductive pattern capable of withstanding temperatures as high as 750° C.

24. The method of claim 21 Wherein said step of depositing said conformal oxide layer further comprises depositing from about 7000 to about 15,000 Angstroms of CVD oxide at a temperature of from about 300° to about 350° C. and said step of forming a conductive pattern on said integrated circuit structure further comprises forming a conductive pattern capable of withstanding temperatures as high as 350° C.

25. The method of claim 19 wherein said step of depositing said layer of planarizing material comprises depositing from about 0.45 to about 0.55 microns of polysilicon over said conformal oxide layer.

26. A method of making a highly planarized integrated circuit structure having highly planarized oxide portions using deposited oxide and a polysilicon planarizing layer to planarize said deposited oxide by respectively polishing said polysilicon planarizing material and etching said oxide which comprises:
   (a) depositing over an integrated circuit structure having first portions at a height higher than the remainder of said integrated circuit structure, a conformal oxide layer having a thickness which exceeds the height of said first portions above the remainder of said substrate;
   (b) depositing a planarizing layer of polysilicon over said deposited conformal oxide layer;
   (c) polishing said structure to remove portions of said polysilicon planarizing layer until the highest portions of said underlying conformal oxide layer are exposed;
   (d) selectively etching said exposed highest portions of said conformal oxide layer on said integrated circuit structure in a first etching step with an etchant system capable of removing said conformal oxide layer selectively with respect to said polysilicon layer to remove a portion of said exposed conformal oxide layer;
   (e) polishing said structure a second time to remove raised oxide portions remaining from said etch step; and
   (f) removing the remainder of said polysilicon planarizing layer.

27. The process of claim 26 wherein said step of removing said remainder of said polysilicon layer further comprises etching said structure a second time with an etchant system capable of removing any remaining portions of said polysilicon layer at about the same rate as said oxide until all of said polysilicon layer is removed.

28. The process of claim 26 including the further step of etching the remainder of said structure in an etching step, after removal of all of said polysilicon layer, until all of said deposited conformal oxide over said raised portions of said integrated circuit structure is removed, leaving a highly planarized structure having oxide regions formed therein between said raised portions of said integrated circuit structure with the upper surface of said oxide regions substantially level with the upper surface of said raised portions of said integrated circuit structure.

29. A method of making a highly planarized integrated circuit structure having field oxide regions formed therein between active regions of a substrate using a deposited layer of conformal oxide and a planarizing layer of polysilicon to permit selective etching of raised portions of the conformal oxide layer after polishing said polysilicon planarizing layer to expose such oxide portions, which comprises:
   (a) patterning a silicon substrate with a mask having openings therein conforming to desired formation of field oxide regions in said substrate;
   (b) etching said silicon substrate through said mask to a depth of from about 0.45 microns to about 0.55 microns;

(c) removing said mask;
(d) depositing from about 7000 to about 9000 Angstroms of a conformal oxide layer over said structure;
(e) depositing a polysilicon planarizing layer over said conformal oxide layer;
(f) polishing said polysilicon layer to remove portions of said polysilicon layer until the highest portions of said underlying conformal oxide layer are exposed;
(g) selectively etching said exposed highest portions of said conformal oxide layer on said integrated circuit structure with an etchant system capable of removing said conformal oxide and said polysilicon layer at an oxide:polysilicon removal rate of at least about 8:1 until about 0.5 microns of said exposed conformal oxide layer has been removed;
(h) polishing said structure a second time to remove raised oxide portions remaining from said etch step; and
(i) removing any remaining portions of said polysilicon layer.

30. The process of claim 29 wherein said step of removing said remaining portions of said polysilicon layer further comprises etching said structure a second time with an etchant system capable of removing any remaining portions of said polysilicon layer at about the same rate as said oxide until all of said polysilicon layer is removed.

31. The process of claim 30 including the further step of etching the remainder of said structure, after removal of the remainder of said polysilicon layer, with an etchant which will etch oxide at a faster rate than silicon until all of said conformal oxide over said active regions is removed leaving a highly planarized structure having field oxide regions formed therein between active regions in the substrate with the upper surface of the field oxide regions substantially level with the surface of the active regions.

* * * * *